United States Patent
Vadakkanmaruveedu et al.

(10) Patent No.: US 9,310,139 B2
(45) Date of Patent: Apr. 12, 2016

(54) VAPOR CHAMBERS BASED SKIN MATERIAL FOR SMARTPHONES AND MOBILE DEVICES

(71) Applicant: QUALCOMM Incorporated, San Diego, CA (US)

(72) Inventors: Unnikrishnan Vadakkanmaruveedu, San Diego, CA (US); Mulugeta K. Berhe, San Diego, CA (US); Vinay Mitter, San Diego, CA (US); Ankur Jain, San Diego, CA (US); Paras S. Doshi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 404 days.

(21) Appl. No.: 13/842,444

(22) Filed: Mar. 15, 2013

(65) Prior Publication Data

US 2014/0262160 A1    Sep. 18, 2014

(51) Int. Cl.
*H05K 7/20* (2006.01)
*G06F 1/20* (2006.01)
*F28D 15/02* (2006.01)
*F28D 21/00* (2006.01)

(52) U.S. Cl.
CPC ............ *F28D 15/02* (2013.01); *G06F 1/203* (2013.01); *H05K 7/2029* (2013.01); *F28D 2021/0028* (2013.01); *G06F 2200/201* (2013.01); *Y10T 29/49359* (2015.01)

(58) Field of Classification Search
CPC .......... H05K 7/20336; H05K 7/20436; H05K 7/20445; H05K 7/20518
See application file for complete search history.

(56) References Cited

U.S. PATENT DOCUMENTS

| 6,044,899 | A  | * | 4/2000  | Langley et al. ......... 165/104.33 |
|---|---|---|---|---|
| 6,122,166 | A  | * | 9/2000  | Mochizuki et al. ...... 361/679.52 |
| 6,202,739 | B1 |   | 3/2001  | Pal et al. |
| 6,418,017 | B1 | * | 7/2002  | Patel et al. ................... 361/700 |
| 6,525,420 | B2 | * | 2/2003  | Zuo et al. ....................... 257/715 |
| 6,788,537 | B2 | * | 9/2004  | Saita et al. .................... 361/700 |
| 6,798,661 | B1 | * | 9/2004  | Barsun et al. ................ 361/700 |
| 6,858,929 | B2 | * | 2/2005  | Zuo et al. ...................... 257/704 |
| 6,977,815 | B2 | * | 12/2005 | Hsu ............................... 361/704 |

(Continued)

FOREIGN PATENT DOCUMENTS

| DE | 3738897 A1 | * | 5/1989 | .............. H01L 23/40 |
|---|---|---|---|---|
| WO | 2010107437 A1 |   | 9/2010 | |

OTHER PUBLICATIONS

Vadakkan U., et al., "Transient Analysis of Flat Heat Pipes," Proceedings of HT2003, ASME Summer Heat Transfer Conference, Las Vegas, Nevada, USA, HT2003-47349, Jul. 21-23, 2003, pp. 1-11.

*Primary Examiner* — Robert J Hoffberg
(74) *Attorney, Agent, or Firm* — Foley & Lardner LLP (57) ABSTRACT

An apparatus for managing heat generated by at least one electronic component of a mobile device, the apparatus comprising: a housing for containing the electronic component of the mobile device; and a vapor chamber arranged in the housing, the vapor chamber having a cavity defined by a front wall and a rear wall opposite the rear wall, the front wall for receiving heat generated by the electronic component of the mobile device to evaporate fluid in the cavity into a vapor, the rear wall for receiving the vapor to allow the vapor to condense to liquid thereby cooling the rear wall of the vapor chamber; wherein an outer surface of the housing comprises at least a portion of the rear wall of the vapor chamber.

25 Claims, 8 Drawing Sheets

(56) References Cited

U.S. PATENT DOCUMENTS

| | | | |
|---|---|---|---|
| 7,005,738 B2* | 2/2006 | Zuo et al. | 257/714 |
| 7,040,383 B2* | 5/2006 | Oyamada | 165/104.33 |
| 7,064,956 B2* | 6/2006 | Patel | H05K 7/20 353/54 |
| 7,130,193 B2* | 10/2006 | Hirafuji et al. | 361/700 |
| 7,145,775 B2* | 12/2006 | Barsun et al. | 361/719 |
| 7,319,590 B1* | 1/2008 | Ingram | 361/704 |
| 7,663,883 B2* | 2/2010 | Shirakami et al. | 361/700 |
| 7,907,409 B2* | 3/2011 | Wyatt et al. | 361/700 |
| 8,218,321 B2* | 7/2012 | Foxenland | 361/700 |
| 8,659,892 B2* | 2/2014 | Yan et al. | 361/679.52 |
| 8,970,029 B2* | 3/2015 | Lin et al. | 257/719 |
| 9,007,769 B2* | 4/2015 | Cheng et al. | 361/700 |
| 9,007,770 B2* | 4/2015 | Cheng et al. | 361/700 |
| 9,013,875 B2* | 4/2015 | Cheng et al. | 361/700 |
| 9,013,876 B2* | 4/2015 | Cheng et al. | 361/700 |
| 2001/0022219 A1* | 9/2001 | Ikeda et al. | 165/46 |
| 2004/0252454 A1* | 12/2004 | Chen | 361/687 |
| 2005/0168941 A1* | 8/2005 | Sokol et al. | 361/688 |
| 2009/0154113 A1* | 6/2009 | MacDonald | 361/720 |
| 2010/0300654 A1 | 12/2010 | Edwards | |
| 2011/0174474 A1 | 7/2011 | Liu et al. | |
| 2012/0118540 A1 | 5/2012 | Tracy et al. | |
| 2014/0352926 A1* | 12/2014 | Sun et al. | 165/104.26 |

* cited by examiner

B900 providing a housing for containing the electronic component of the mobile device — B910 arranging a vapor chamber in the housing, the vapor chamber having a cavity defined by a front wall and a rear wall opposite the rear wall, the front wall for receiving heat generated by the electronic component of the mobile device to evaporate fluid in the cavity into a vapor, the rear wall for receiving the vapor to allow the vapor to condense to liquid thereby cooling the rear wall of the vapor chamber, wherein an outer surface of the housing comprises at least a portion of the rear wall of the vapor chamber — B920

FIG. 9

VAPOR CHAMBERS BASED SKIN MATERIAL FOR SMARTPHONES AND MOBILE DEVICES

BACKGROUND

1. Field

The disclosure relates generally to the field of heat management and, in particular, to heat management in mobile devices.

2. Background

Because of the high power generated by mobile devices, temperature limit is one of the bottlenecks in improving performance of mobile devices. There are generally three temperature limits that should avoided during operation of mobile devices. The first limit is the junction temperature limit (which is typically 90-125° C.). The second limit is the memory temperature limit (e.g., 85-105° C.). The third limit relates to the temperature of a surface of the device touched by a user, for example, when holding the device (e.g., rear surface of the device). This limit is about 45° C. for devices with plastic housings and about 41° C. for devices with metal housings. In many common-use instances, this limit is likely to be violated first.

Heat in a mobile device is concentrated greatly around the electronic components of the mobile device. Heat from these components may produce a "hotspot" at a surface of the mobile device housing. The temperature of the hotspot is based on the ability of the housing to spread heat from the hotspot. Because plastic is a poor conductor of heat, and has a higher spreading resistance, housings made of such material can generate hotspots having high temperatures.

SUMMARY

An apparatus for managing heat generated by at least one electronic component of a mobile device includes, but is not limited to, a housing and a vapor chamber. The housing may be for containing the electronic component of the mobile device. The vapor chamber may be arranged in the housing. The vapor chamber having a cavity defined by a front wall and a rear wall opposite the rear wall. The front wall may be for receiving heat generated by the electronic component of the mobile device to evaporate fluid in the cavity into a vapor. The rear wall may be for receiving the vapor to allow the vapor to condense to liquid thereby cooling the rear wall of the vapor chamber. The outer surface of the housing comprises at least a portion of the rear wall of the vapor chamber.

In various embodiments, the vapor chamber is arranged such that the front wall of the vapor chamber faces a first surface of the electronic component.

In some embodiments, the first surface of the electronic component is opposite a second surface of the electronic component that is facing a circuit substrate on which the electronic component is supported.

In some embodiments, the first surface of the electronic component has a larger surface area than at least one other surface of the electronic component.

In various embodiments, the vapor chamber is arranged such that the front wall of the vapor chamber faces a first surface of a circuit substrate on which the electronic component is supported.

In various embodiments, the outer surface of the housing is opposite a front surface of the housing on which a display is provided.

In various embodiments, the chamber comprises a first vapor chamber and a second vapor chamber. The outer surface of the housing comprises at least a portion of the rear wall of the first vapor chamber and at least a portion of the rear wall of the second vapor chamber.

In various embodiments, the chamber comprises a first vapor chamber and a second vapor chamber. The front wall of the first vapor chamber is arranged to receive heat generated by a first electronic component of the mobile device and the front wall of the second vapor chamber is arranged to receive heat generated by a second electronic component of the mobile device. The outer surface of the housing comprises at least a portion of the rear wall of the first vapor chamber and at least a portion of the rear wall of the second vapor chamber.

In various embodiments, vapor chamber having a portion thermally connected to the front wall and extending over a first surface of the electronic component.

In some embodiments, the electronic component is supported on a circuit substrate. The electronic component extends from the circuit substrate in a first direction. The front wall is aligned with at least a portion of the electronic component and at least a portion of the circuit substrate in the first direction In some embodiments, the front wall is aligned with the rear wall in a second direction. The second direction is transverse the first direction.

An apparatus for managing heat generated by at least one electronic component of a mobile device includes, but is not limited to, a housing means for containing the electronic component of the mobile device; and a cooling means arranging in the housing means, the cooling means having a cavity defined by a front wall and a rear wall opposite the rear wall, the front wall for receiving heat generated by the electronic component of the mobile device to evaporate fluid in the cavity into a vapor, the rear wall for receiving the vapor to allow the vapor to condense to liquid thereby cooling the rear wall of the vapor chamber. An outer surface of the housing comprises at least a portion of the rear wall of the vapor chamber.

A method of manufacturing an apparatus for managing heat generated by at least one electronic component of a mobile device includes, but is not limited to, any one of combination of: providing a housing for containing the electronic component of the mobile device; and arranging a vapor chamber in the housing, the vapor chamber having a cavity defined by a front wall and a rear wall opposite the rear wall, the front wall for receiving heat generated by the electronic component of the mobile device to evaporate fluid in the cavity into a vapor, the rear wall for receiving the vapor to allow the vapor to condense to liquid thereby cooling the rear wall of the vapor chamber. An outer surface of the housing comprises at least a portion of the rear wall of the vapor chamber.

DETAILED DESCRIPTION

According to various embodiments, a vapor chamber may be provided in a housing of a mobile device to reduce a temperature at a surface of the housing of the mobile device.

Figure 1:
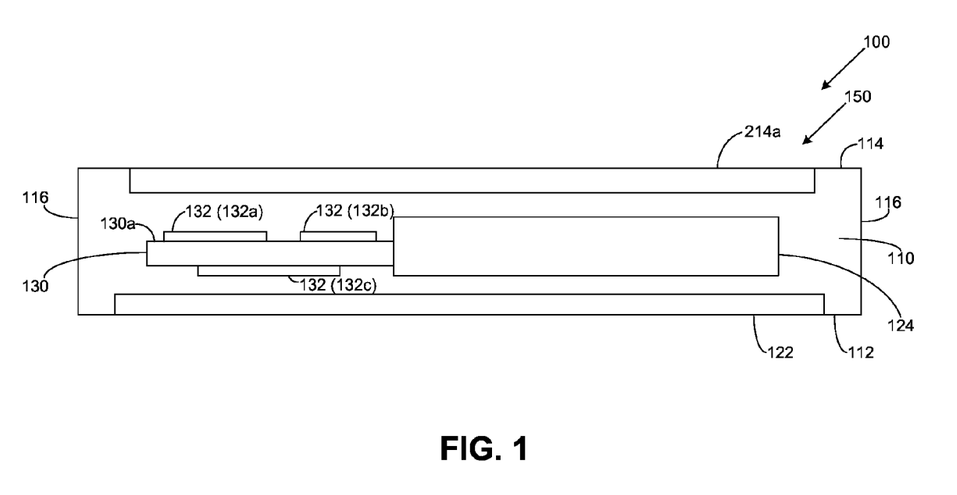
FIG. 1 is a cross-section view of a mobile device having a vapor chamber according to various embodiments of the disclosure.

FIG. 1 illustrates a mobile device 100, such as (but not limited to) a cellular phone, a tablet, a personal data assistant (PDA), a laptop, an MP3 player, a music player, a video player, a media player, a navigational device, a telematics devices, or other portable electronic device.

The mobile device 100 includes a housing 110 that has a front surface 112, a rear surface 114, and side surfaces 116. The housing 110 (or at least a portion thereof) may be made of a rigid material, such as (but not limited to) plastic, metal, composite material, resin, or the like. The mobile device 100 may include a display 122 (e.g., touch screen display or other display type) provided on the front surface 112 of the mobile device. The mobile device 100 may include a battery 124, for example provided in the housing 110, for operating the mobile device 100.

The mobile device 100 includes a circuit substrate 130, such as a printed circuit board (PCB) within the housing 110. The mobile device 100 may include various electronic components 132 (132a-132c). At least some of the electronic components 132a, 132b may be supported on a first surface 130a of the circuit substrate 130. In particular embodiments, the first surface of the circuit substrate faces a surface (e.g., rear surface 114) of the housing 110 to be cooled. The various electronic components 132 may also include components such as the display 122, the battery 124, and/or the like.

Figure 2:
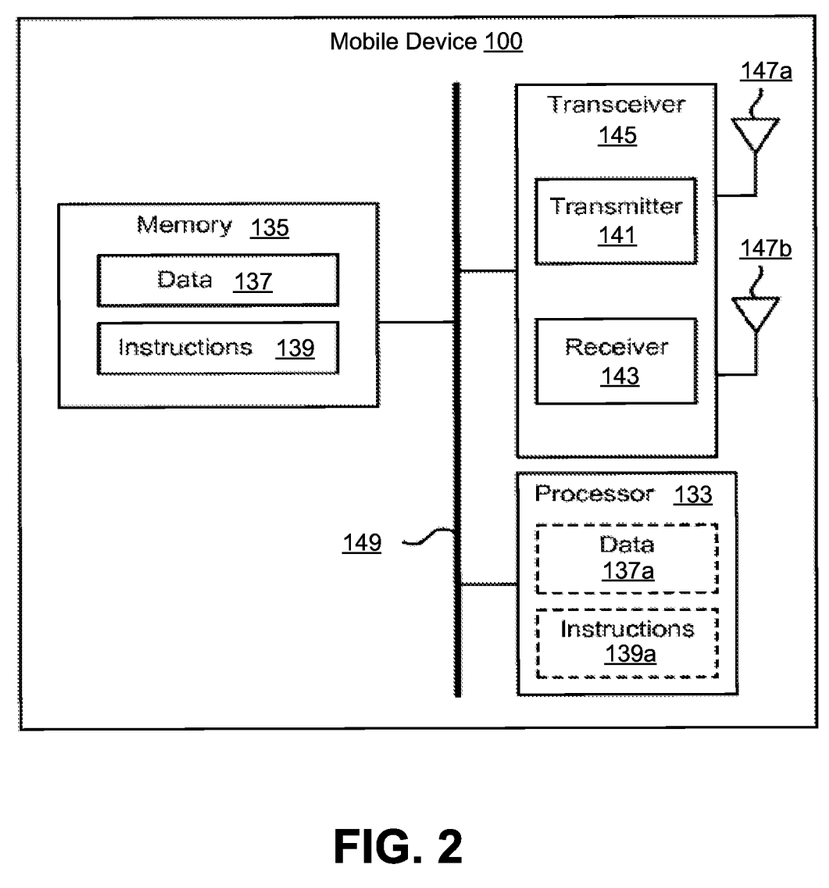
FIG. 2 illustrates certain components of a mobile device according to various embodiments of the disclosure.

FIG. 2 illustrates certain components that may be included within the mobile device 100. With reference to FIGS. 1 and 2, the mobile device 100 may include a processor 133, which may be supported on the circuit substrate 130. The processor 133 may be a general purpose single- or multi-chip microprocessor (e.g., an ARM), a special purpose microprocessor (e.g., a digital signal processor (DSP)), a microcontroller, a programmable gate array, etc. The processor 133 may be referred to as a central processing unit (CPU). Although just a single processor 133 is shown in the mobile device 100, in an alternative configuration, a combination of processors (e.g., an ARM, DSP, etc.) could be used.

The mobile device 100 may include memory 135. The memory 135 may be any electronic component capable of storing electronic information. The memory 135 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 137 and instructions 139 may be stored in the memory 135. The instructions 139 may be executable by the processor 133 to implement the methods disclosed herein. Executing the instructions 139 may involve the use of the data 137 that is stored in the memory 135. When the processor 133 executes the instructions 137, various portions of the instructions 139a may be loaded onto the processor 133, and various pieces of data 137a may be loaded onto the processor 133.

The mobile device 100 may also include a transmitter 141 and a receiver 143 to allow transmission and reception of signals between the mobile device 100 and a remote location. The transmitter 141 and receiver 143 may be collectively referred to as a transceiver 145. An antenna 147 may be electrically coupled to the transceiver 145. The mobile device 100 may also include (not shown) multiple transmitters, multiple receivers, multiple transceivers and/or multiple antenna.

The various components of the mobile device 100 may be coupled together by one or more buses, which may include a power bus, a control signal bus, a status signal bus, a data bus, etc. For the sake of clarity, the various buses are shown as bus system 149. Any one or more of the components 133, 135, 141, 143, 145, 147 (and/or other components) may be one or more of the electronic components 132 supported on the circuit substrate 130.

During operation of the mobile device 100, one or more components of the mobile device 100, such as one or more of the electronic components 132 (e.g., the processor 133, the memory 135, the battery 124, the display 122, etc.), may generate heat. Thus, in various embodiments, the mobile device 100 (e.g., the housing 110) may be configured to manage the heat generated by the electronic components 132. In particular embodiments, the mobile device 100 may be configured to manage temperature at a surface (e.g., rear surface 114) of the housing 110, thus reducing a temperature of a hotspot along the surface of the housing 110.

Figure 3:
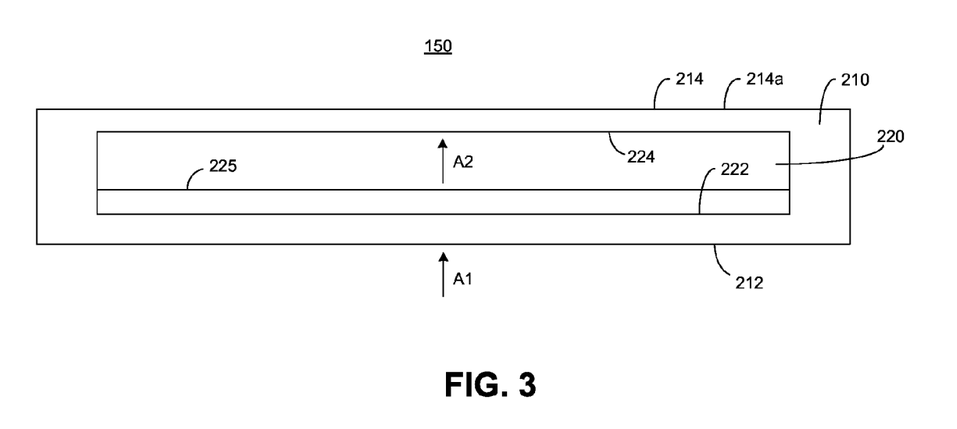
FIG. 3 is a cross-section view of a vapor chamber according to various embodiments of the disclosure.

In some embodiments, the mobile device 100 includes a vapor chamber 150 (which may also be referred to as a flat heat pipe). FIG. 3 illustrates the vapor chamber 150 according to various embodiments of the disclosure. With reference to FIGS. 1-3, the vapor chamber 150 is a closed two-phase system in which heat spreads by movement of vapor inside the closed vapor chamber 150. The vapor chamber 150 is a passive heat transfer device utilizing latent heat of vaporization in transferring large quantities of heat with minimal temperature drop. The heat will spread through a vapor region of the vapor chamber 150 to reduce a temperature of a surface of the housing 110.

According to various embodiments, the vapor chamber 150 may be configured in any suitable manner. In some embodiments, for example, the vapor chamber 150 may include a body (or casing) 210 having a front wall 212 and a rear wall 214 opposite the front wall 212. The front wall 212 may be arranged to receive heat from one or more of the heat-generating electronic components 132 (e.g., 132a, 132b, 124, 122, etc.). For instance, the front wall 212 may be arranged to face the one or more heat-generating electronic components 132. In some embodiments, the one or more heat-generating electronic components 132 are supported on the first surface 130a of the circuit substrate 130. In particular embodiments, the front wall 212 may be arranged to face a surface of the heat-generating electronic component 132 generating the most heat (e.g., the surface with the largest surface area) relative to other surfaces of the electronic component 132. Thus in some embodiments, the front wall 212 may be aligned with the one or more heat-generating electronic components 132 in a first direction A1. In other embodiments, the one or more heat-generating electronic components 132 are not supported on a different surface of the circuit substrate 130 other than the first surface 130a. In yet other embodiments, the one or more heat-generating electronic components 132 (e.g., display 122) are not supported on the circuit substrate 130.

The body 210 of the vapor chamber 150 includes a cavity 220, which is defined by a rear surface 224 (of the rear wall 214) and a front surface 222 (of the front wall 212). A fluid (liquid) is provided in the cavity 220. For instance, the fluid may be provided in a wick structure 225 arranged on the front surface 222. The fluid (which may be referred to as a working fluid) may be any suitable coolant, such as (but not limited to) water, ethanol, acetone, sodium, mercury, and/or the like.

In particular, heat from inside the mobile device 100, such as (but not limited to) heat generated from the electronic component 132*a* (e.g., processor 133), is received at the front wall 212 and causes the fluid in the wick structure 225 to evaporate to vapor within the cavity 220 of the vapor chamber 150. The vapor migrates along the cavity 220 (e.g., in a second direction A2) to the rear surface 224, which is at a lower temperature. The vapor on the rear surface 224 condenses back to fluid (liquid). As the vapor condenses, latent energy is released, thus cooling the rear wall 214. Accordingly, by placing the rear wall 214 in proximity with or as part of a surface (e.g., rear surface 114 or the like) of the housing 110 of the mobile device 100, the surface of the housing 110 may be cooled via the vapor chamber 150.

With reference to FIGS. 1-5, according to various embodiments, the vapor chamber 150 is at least a portion of a surface, such as the rear surface 114, of the housing 110 to cool (spread heat) along the surface of the housing 110. In particular embodiments, the rear wall 214 of the vapor chamber 150 is at least a portion of the rear surface 114 (or other surface to be cooled) of the housing 110 to cool the rear surface 114 of the housing 110. That is, outer surface 214*a* of the rear wall 214 is at least a portion of the surface of the housing 110 to be cooled. In other embodiments, the vapor chamber 150 is the entire portion of a surface, such as the rear surface 114, of the housing 110 to cool (spread heat) along the surface of the housing 110. In particular embodiments, the rear wall 214 of the vapor chamber 150 may be the entire portion of the rear surface 114 of the housing 110 (e.g., refer to FIG. 5).

Figure 4:
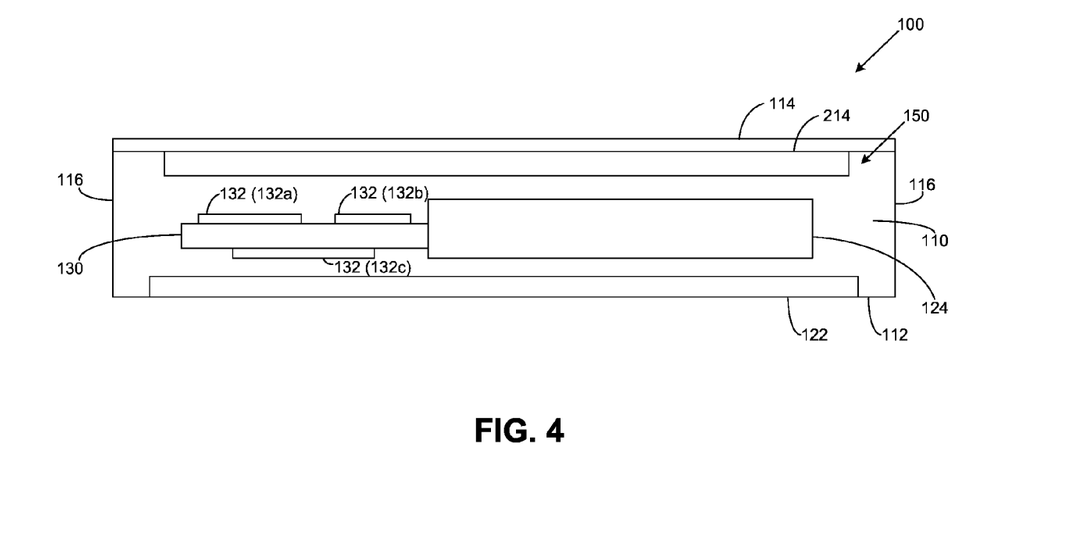
FIG. 4 is a cross-section view of a mobile device having a vapor chamber according to various embodiments of the disclosure.
Figure 5:
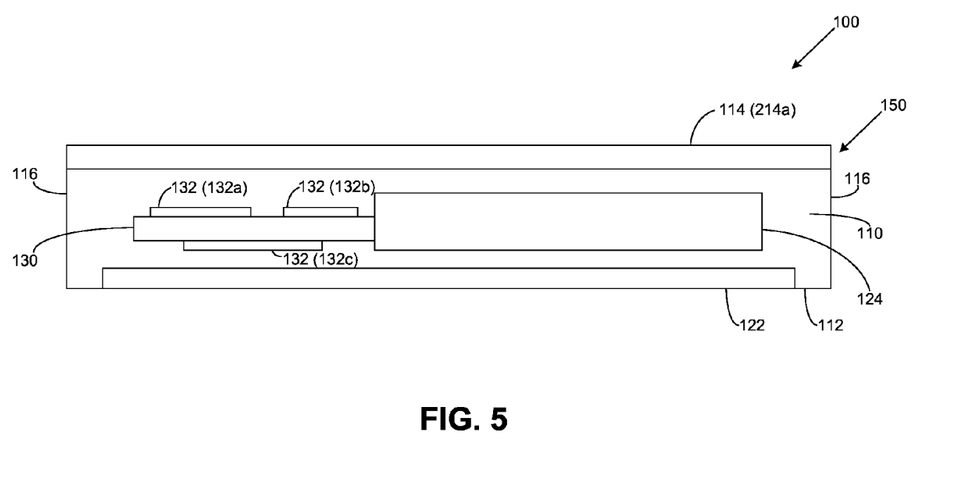
FIG. 5 is a cross-section view of a mobile device having a vapor chamber according to various embodiments of the disclosure.
}
Figure 6:
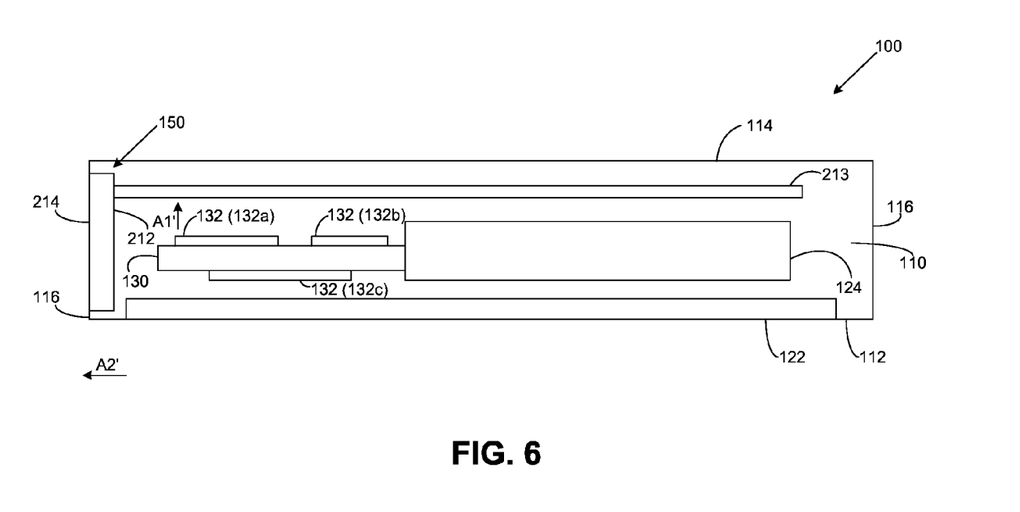
FIG. 6 is a cross-section view of a mobile device having a vapor chamber according to various embodiments of the disclosure.
Figure 7:
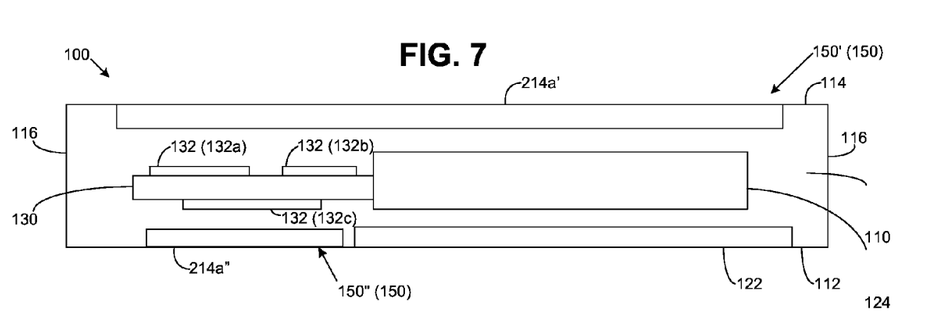
FIG. 7 is a cross-section view of a mobile device having a vapor chamber according to various embodiments of the disclosure.
Figure 8:
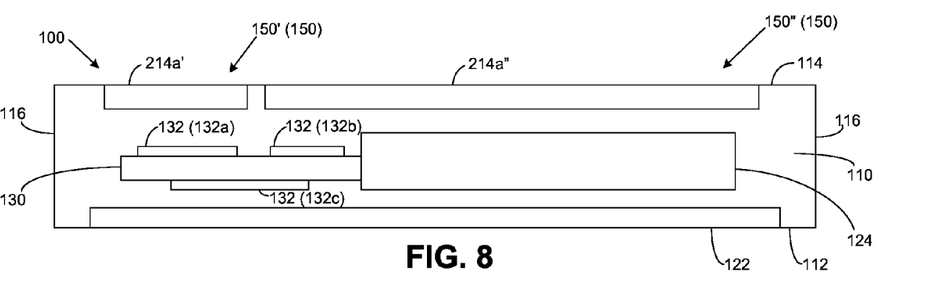
FIG. 8 is a cross-section view of a mobile device having a vapor chamber according to various embodiments of the disclosure.

According to various embodiments, the vapor chamber 150 is arranged between a surface, such as the rear surface 114, of the housing 110 and the heat-generating electronic component (e.g., 132*a*) supported on the circuit substrate 130 (e.g., refer to FIG. 4). As such, for example, the vapor chamber 150 (e.g., the rear wall 214) is not a portion of the rear surface 114 of the housing 110.

With reference to FIGS. 1-6, in various embodiments, the vapor chamber 150 (and/or the housing 110) is arranged or otherwise configured such that the heat-generating electronic component 132 is aligned with the front wall 212 and the rear wall 214. Thus for instance, the first direction A1 may be parallel to the second direction A2. As such, the surface (of the housing 110) to be cooled may be parallel with the surface of the heat-generating electronic component 132.

In other embodiments, the vapor chamber 150 (and/or the housing 110) is configured such that a surface of the housing 110 to be cooled is transverse the surface of the heat-generating electronic component 132. For example, the sidewalls 116 of the housing 110 may be cooled in addition to or in alternative of the rear wall 114 (e.g., refer to FIG. 5). In particular embodiments, the front wall 212 of the vapor chamber 150 may have a portion 213 (e.g., a heat antenna or the like) thermally connected to the front wall 212 and extending from the front wall 212 over the heat-generating electronic component 132 (aligned in a first direction A1'). The portion 213 receives heat generated from the electronic component 132 or the like and conducts the heat to the front wall 214 to cause fluid in the cavity 220 to be evaporated to vapor that migrates in a second direction A2' that is transverse the first direction (e.g., refer to FIG. 6). As such, the surface (of the housing 110) to be cooled may be transverse the surface of the heat-generating electronic component 132. Thus, in various embodiments, thermal management may be provided for any particular surface of the housing 110 of the mobile device 100 relative to location and/or arrangement of a heat-generating component.

With reference to FIGS. 1-8, in various embodiments, a single vapor chamber 150 is implemented to manage heat within the mobile device (e.g., refer to FIGS. 1-6). In other embodiments, a plurality of vapor chambers 150 may be used (e.g., refer to FIGS. 7 and 8). In particular embodiments, vapor chambers 150 may be implemented for different surfaces to be cooled. For example, a first vapor chamber 150' may be provided for cooling the rear surface 114 of the housing 110 and a second vapor chamber 150" may be provided for cooling the front surface 112 of the housing 110 (e.g., refer to FIG. 7). Thus, for instance, the rear surface 114 of the housing 110 may also include the outer rear surface 214*a*' of the first vapor chamber 150' and the front surface 112 of the housing 110 may also include the outer rear surface 214*a*" of the second vapor chamber 150".

In other particular embodiments, vapor chambers 150 may be implemented for managing heat from different components. For example, a first vapor chamber 150' may be provided for cooling the electronic component 132*a* and a second vapor chamber 150" may be provided for cooling the electronic component 132*b* and the battery 124 (e.g., refer to FIG. 8). Thus, for instance, the rear surface 114 of the housing 110 may also include the outer rear surface 214*a*' of the first vapor chamber 150' and the outer rear surface 214*a*" of the second vapor chamber 150". In some embodiments, the plurality of vapor chambers 150 may be configured in the same manner (e.g., size, composition, etc.). In other embodiments, one of more of the vapor chambers 150 may be configured individually. For example, a first vapor chamber 150' may be configured to provide a different temperature change and/or implement a different surface area amount than a second vapor chamber 150" (e.g., refer to FIG. 8).

Figure 9:
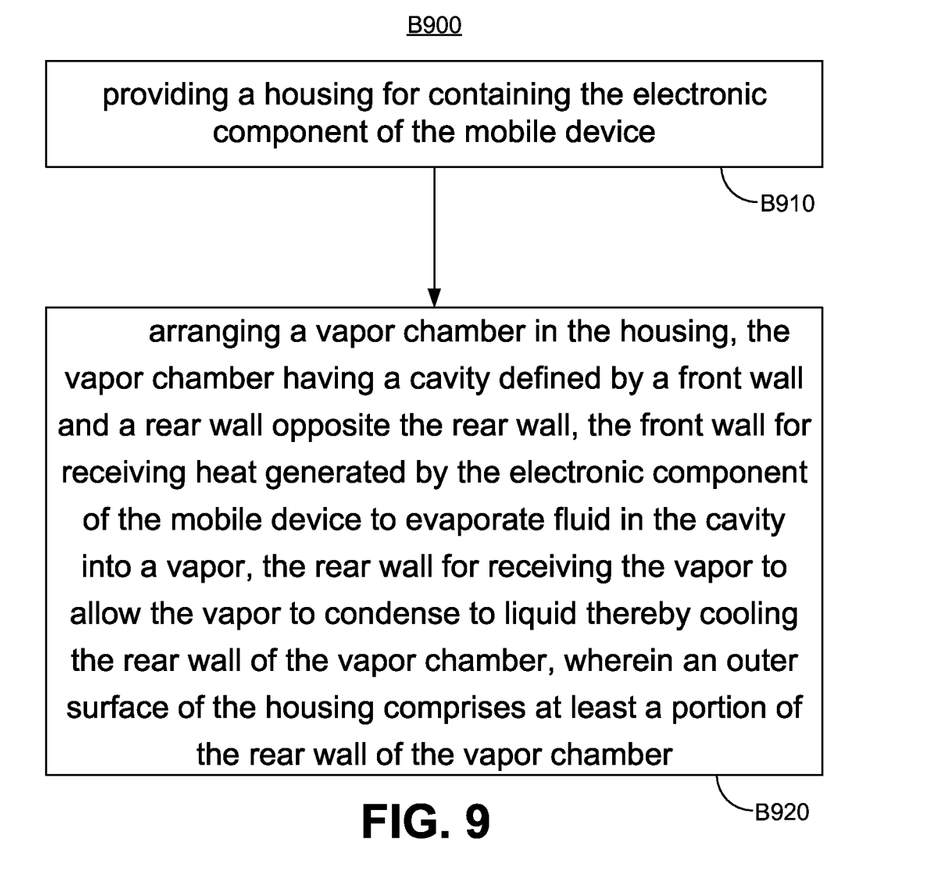
FIG. 9 is a flowchart of a method of an apparatus for managing heat generated by at least one electronic component of a mobile device according to various embodiments of the disclosure.

FIG. 9 is a flowchart of a method B900 of manufacturing an apparatus for managing heat generated by at least one electronic component of a mobile device (e.g., 100 in FIG. 1). With reference to FIGS. 1-9, the method B900 includes, at block B910, providing a housing (e.g., 110) for containing the electronic component (e.g. 132, 122, 124) of the mobile device. The method B900 further includes, at block B920, arranging a vapor chamber (e.g., 150) in the housing. The vapor chamber has a cavity (e.g., 220) defined by a front wall (e.g., 212) and a rear wall (e.g., 214) opposite the rear wall. The front wall receives heat generated by the electronic component of the mobile device to evaporate fluid in the cavity into a vapor. The rear wall receives the vapor to allow the vapor to condense to liquid thereby cooling the rear wall of the vapor chamber. An outer surface (e.g., 114) of the housing comprises at least a portion of the rear wall of the vapor chamber.

With reference to FIGS. 1-9, in various embodiments, the housing 110 may be configured to receive the vapor chamber 150, for example, during manufacture of the mobile device 100 or the housing 110. For instance, the housing 110 may include a recess (not shown) within the housing 110 for receiving the vapor chamber 150 within the housing 110. As another example, the housing 110 may include a recess for receiving the vapor chamber 150 to form an outer surface (e.g., rear surface 114) of the housing 110.

It should be noted that the embodiments of each of FIGS. 1-9 are merely illustrative. It should be understood that any of the features of the embodiments of FIGS. 1-9 may be combined or otherwise incorporated into any other of the other embodiments of FIGS. 1-9 as well as any other embodiment herein discussed.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. An apparatus for managing heat generated by at least one electronic component of a mobile device, the apparatus comprising:
    a housing having an outer surface, the outer surface comprising a front surface and a rear surface opposite the front surface, the housing for containing the at least one electronic component and a display of the mobile device; and
    a vapor chamber arranged in the housing, the vapor chamber having a cavity defined by a front wall and a rear wall opposite the front wall, the front wall for receiving the heat generated by the at least one electronic component of the mobile device to evaporate a fluid in the cavity into a vapor, the rear wall for receiving the vapor to allow the vapor to condense to a liquid thereby cooling the rear wall of the vapor chamber, the vapor chamber being at the rear surface of the housing and the display being at the front surface of the housing, and the display facing away from the vapor chamber;
    wherein the outer surface of the housing comprises at least a portion of the rear wall of the vapor chamber.

2. The apparatus of claim 1, wherein the vapor chamber is arranged such that the front wall of the vapor chamber faces a first surface of the at least one electronic component.

3. The apparatus of claim 2, wherein the first surface of the at least one electronic component is opposite a second surface of the at least one electronic component that is facing a circuit substrate on which the at least one electronic component is supported.

4. The apparatus of claim 2, wherein the first surface of the at least one electronic component has a larger surface area than at least one other surface of the at least one electronic component.

5. The apparatus of claim 1, wherein the vapor chamber is arranged such that the front wall of the vapor chamber faces a first surface of a circuit substrate on which the at least one electronic component is supported.

6. The apparatus of claim 1, wherein the rear wall of the vapor chamber is opposite the front surface of the housing on which the display is provided.

7. The apparatus of claim 1,
    wherein the vapor chamber comprises a first vapor chamber and a second vapor chamber; and
    wherein the outer surface of the housing comprises at least a portion of the rear wall of the first vapor chamber and at least a portion of the rear wall of the second vapor chamber.

8. The apparatus of claim 1,
    wherein the vapor chamber comprises a first vapor chamber and a second vapor chamber;
    wherein the at least one electronic component comprises a first electronic component and a second electronic component;
    wherein the front wall of the first vapor chamber is arranged to receive a first portion of the heat generated by the first electronic component of the mobile device and the front wall of the second vapor chamber is arranged to receive a second portion of the heat generated by the second electronic component of the mobile device; and
    wherein the outer surface of the housing comprises at least a portion of the rear wall of the first vapor chamber and at least a portion of the rear wall of the second vapor chamber.

9. The apparatus of claim 1, wherein at least a portion of the front wall of the vapor chamber extends over a first surface of the at least one electronic component.

10. The apparatus of claim 9,
    wherein the at least one electronic component is supported on a circuit substrate, the at least one electronic component extending from the circuit substrate in a first direction; and
    wherein the front wall is aligned with at least a portion of the at least one electronic component and at least a portion of the circuit substrate in the first direction.

11. The apparatus of claim 10,
    wherein the front wall is aligned with the rear wall in a second direction; and
    wherein the second direction is transverse the first direction.

12. The apparatus of claim 1, further comprising an additional vapor chamber on the front surface of the housing such that the display and the additional vapor chamber are at a same surface of the housing.

13. The apparatus of claim 1, wherein the display is a touch screen display.

14. An apparatus for managing heat generated by at least one electronic component of a mobile device, the apparatus comprising:
    a housing means having an outer surface, the outer surface comprising a front surface and a rear surface opposite the front surface, the housing means for containing the at least one electronic component and a display of the mobile device; and
    a cooling means for arranging in the housing means, the cooling means having a cavity defined by a front wall and a rear wall opposite the front wall, the front wall for receiving the heat generated by the at least one electronic component of the mobile device to evaporate a fluid in the cavity into a vapor, the rear wall for receiving the vapor to allow the vapor to condense to a liquid thereby cooling the rear wall of the cooling means, the cooling means being at the rear surface of the housing and the display being at the front surface of the housing, and the display facing away from the cooling means;
    wherein the outer surface of the housing means comprises at least a portion of the rear wall of the cooling means.

15. The apparatus of claim 14, wherein the cooling means is arranged such that the front wall of the cooling means faces a first surface of the at least one electronic component.

16. The apparatus of claim 15, wherein the first surface of the at least one electronic component is opposite a second surface of the at least one electronic component that is facing a circuit substrate on which the at least one electronic component is supported.

17. The apparatus of claim 15, wherein the first surface of the at least one electronic component has a larger surface area than at least one other surface of the at least one electronic component.

18. The method of claim 15, wherein the first surface of the at least one electronic component is opposite a second surface of the at least one electronic component that is facing a circuit substrate on which the at least one electronic component is supported.

19. The method of claim 15, wherein the first surface of the at least one electronic component has a larger surface area than at least one other surface of the at least one electronic component.

20. The apparatus of claim 14, wherein the rear wall of the vapor chamber is opposite the front surface of the housing means on which the display is provided.

21. The apparatus of claim 14, wherein the cooling means is arranged such that the front wall of the vapor chamber faces a first surface of a circuit substrate on which the at least one electronic component is supported.

22. A method of manufacturing an apparatus for managing heat generated by at least one electronic component of a mobile device, the method comprising:
providing a housing having an outer surface, the outer surface comprising a front surface and a rear surface opposite the front surface, the housing for containing the at least one electronic component and a display of the mobile device; and
arranging a vapor chamber in the housing, the vapor chamber having a cavity defined by a front wall and a rear wall opposite the front wall, the front wall for receiving the heat generated by the at least one electronic component of the mobile device to evaporate a fluid in the cavity into a vapor, the rear wall for receiving the vapor to allow the vapor to condense to a liquid thereby cooling the rear wall of the vapor chamber, the vapor chamber being at the rear surface of the housing and the display being at the front surface of the housing, and the display facing away from the vapor chamber;
wherein the outer surface of the housing comprises at least a portion of the rear wall of the vapor chamber.

23. The method of claim 22, wherein the vapor chamber is arranged such that the front wall of the vapor chamber faces a first surface of the at least one electronic component.

24. The method of claim 22, wherein the rear wall of the vapor chamber is opposite the front surface of the housing on which the display is provided.

25. The method of claim 22, wherein the vapor chamber is arranged such that the front wall of the vapor chamber faces a first surface of a circuit substrate on which the at least one electronic component is supported.

* * * * *